(12) United States Patent
Sato

(10) Patent No.: US 9,231,175 B2
(45) Date of Patent: Jan. 5, 2016

(54) LIGHT EMITTING DEVICE WITH SEALING MEMBER CONTAINING FILLER PARTICLES

(75) Inventor: Masanobu Sato, Tokushima (JP)

(73) Assignee: NICHIA CORPORATION, Anan-shi (JP)

( * ) Notice: Subject to any disclaimer, the term of this patent is extended or adjusted under 35 U.S.C. 154(b) by 0 days.

(21) Appl. No.: 13/337,154

(22) Filed: Dec. 26, 2011

(65) Prior Publication Data

US 2012/0161621 A1 Jun. 28, 2012

(30) Foreign Application Priority Data

Dec. 28, 2010 (JP) ................................. 2010-292204

(51) Int. Cl.
| | |
|---|---|
| H01L 33/52 | (2010.01) |
| H01L 33/58 | (2010.01) |
| H01L 33/56 | (2010.01) |
| H01L 33/54 | (2010.01) |
| H01L 25/075 | (2006.01) |
| H01L 33/50 | (2010.01) |

(52) U.S. Cl.
CPC ............... *H01L 33/56* (2013.01); *H01L 33/54* (2013.01); *H01L 25/0753* (2013.01); *H01L 33/508* (2013.01); *H01L 2224/48091* (2013.01); *H01L 2224/48247* (2013.01); *H01L 2224/73265* (2013.01); *H01L 2924/3025* (2013.01); *H01L 2933/0091* (2013.01)

(58) Field of Classification Search
CPC .. H01L 33/52; H01L 33/54; H01L 2933/0091
USPC ..................................... 313/512; 257/100, 98
See application file for complete search history.

(56) References Cited

U.S. PATENT DOCUMENTS

| | | | | |
|---|---|---|---|---|
| 8,344,400 | B2 * | 1/2013 | Kim et al. ........................ | 257/98 |
| 2003/0189217 | A1 | 10/2003 | Imai | |
| 2004/0241894 | A1 * | 12/2004 | Nagai et al. ..................... | 438/22 |
| 2005/0031791 | A1 * | 2/2005 | Sasaki et al. ............... | 427/372.2 |
| 2005/0231092 | A1 | 10/2005 | Yamazaki | |
| 2007/0182307 | A1 * | 8/2007 | Taguchi et al. ............... | 313/484 |
| 2009/0257000 | A1 * | 10/2009 | Ogasawara et al. ............. | 349/64 |
| 2009/0283794 | A1 * | 11/2009 | Mizuno et al. ................. | 257/100 |
| 2010/0140638 | A1 * | 6/2010 | Kotani et al. ................... | 257/98 |

(Continued)

FOREIGN PATENT DOCUMENTS

| | | |
|---|---|---|
| JP | 59-112665 | 6/1984 |
| JP | 59-151478 | 8/1984 |

(Continued)

OTHER PUBLICATIONS

Extended European Search Report for corresponding EP Application No. 11195585.2-1551, Feb. 24, 2015.

(Continued)

*Primary Examiner* — Karabi Guharay
(74) *Attorney, Agent, or Firm* — Mori & Ward, LLP

(57) ABSTRACT

A light emitting device includes a base substrate, a light emitting element, and a sealing member. The light emitting element is provided on the base substrate. The sealing member seals the light emitting element. The sealing member contains a parent material and filler particles unevenly distributed in a surface side of the sealing member and has a surface which has an irregular geometry formed associated with the filler particles.

20 Claims, 2 Drawing Sheets

(56) References Cited

U.S. PATENT DOCUMENTS

2010/0289048 A1* 11/2010 Kumura .................. 257/98
2011/0037083 A1* 2/2011 Chan et al. ............... 257/89
2012/0043577 A1* 2/2012 Imazawa et al. ........... 257/99

FOREIGN PATENT DOCUMENTS

| | | |
|---|---|---|
| JP | 10-284759 | 10/1998 |
| JP | 11-204840 | 7/1999 |
| JP | 2000-114605 | 4/2000 |
| JP | 2001-060724 | 3/2001 |
| JP | 2001-077433 | 3/2001 |
| JP | 2003-086846 | 3/2003 |
| JP | 2003-298115 | 10/2003 |
| JP | 2005-135983 | 5/2005 |
| JP | 2006-352047 | 12/2006 |
| JP | 2007-234767 | 9/2007 |
| JP | 4167717 B1 | 10/2008 |
| JP | 2009-185120 | 8/2009 |
| JP | 2010-199400 | 9/2010 |
| JP | 2011-176247 | 9/2011 |
| WO | WO 03/092082 | 11/2003 |
| WO | WO 2007/127029 | 11/2007 |

OTHER PUBLICATIONS

Japanese Office Action for corresponding JP Application No. 2011-283391, Oct. 20, 2015.

* cited by examiner

LIGHT EMITTING DEVICE WITH SEALING MEMBER CONTAINING FILLER PARTICLES

CROSS-REFERENCES TO RELATED APPLICATIONS

The present application claims priority under 35 U.S.C. §119 to Japanese Patent Application No. 2010-292204, filed Dec. 28, 2010. The contents of this application are incorporated herein by reference in their entirety.

BACKGROUND OF THE INVENTION

1. Field of the Invention

The present invention relates to a light emitting device.

2. Discussion of the Background

In recent years, a display apparatus such as a large size outdoor display has been put to practical use, in which a plurality of light emitting devices, each having one or more light emitting diodes (LED), are arranged in a matrix. In such display apparatuses, due to the surface gloss of the sealing member which seals the surrounding of the light emitting devices, incident outside light such as sunlight and illumination undergoes total internal reflection at the surface of the sealing member, and hence involve problems such as occurrence of indirect glare and poor display contrast.

In an attempt to solve the problems described above, for example, JP 2000-114605A describes an LED indicator which includes a frame-shaped case, an LED substrate disposed in the case, an LED lamp electrically fixed to the LED substrate, and a sealing resin made of a waterproof synthetic resin which is injected in the case to seal the LED substrate and the bottom edge portion of the resin head of the LED lamp. On the surface of the sealing resin, a microscopic irregularity is formed by exposing glass beads so as to reflect incident outside light as scattering light.

JP 2007-234767A describes a frosted protective member which is formed of a resin layer having fillers dispersed therein and has a surface provided with an irregular geometry including depressions and protrusions which enables to reduce surface gloss, and more fillers are distributed below the depressions than below the protrusions. JP 2003-086846A describes a light emitting element which includes a light emitting chip, a first layer covering the light emitting chip, and a second layer having light diffusing members and provided at least on the first layer. The surface of the second layer has a plurality of protrusions in conformity with the shapes of the light diffusing members. JP 2001-077433A describes a light emitting device which includes a semiconductor light emitting element capable of emitting visible light, a light-transmissive mold member covering the semiconductor light emitting element, fluorescent materials contained in the light-transmissive mold member and capable of absorbing visible light from the semiconductor light emitting element and emitting visible light having a longer wavelength than the absorbed visible light, and a light diffusing agent contained in the light-transmissive mold member. The fluorescent materials have a specific gravity larger than that of the light-transmissive mold member and light diffusing agents. JP H10-284759A describes a light emitting device which includes a light emitting element arranged in a package recess, and a mold member arranged over the light emitting element, and diffusing agents for reducing the rate of decrease in the LED luminance than the rate of decrease in the dark luminance are contained in the mold member.

SUMMARY OF THE INVENTION

According to one aspect of the present invention, a light emitting device includes a base substrate, a light emitting element, and a sealing member. The light emitting element is provided on the base substrate. The sealing member seals the light emitting element. The sealing member contains a parent material and filler particles unevenly distributed in a surface side of the sealing member and has a surface which has an irregular geometry formed associated with the filler particles.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings.

DESCRIPTION OF THE EMBODIMENTS

Figure 1A:
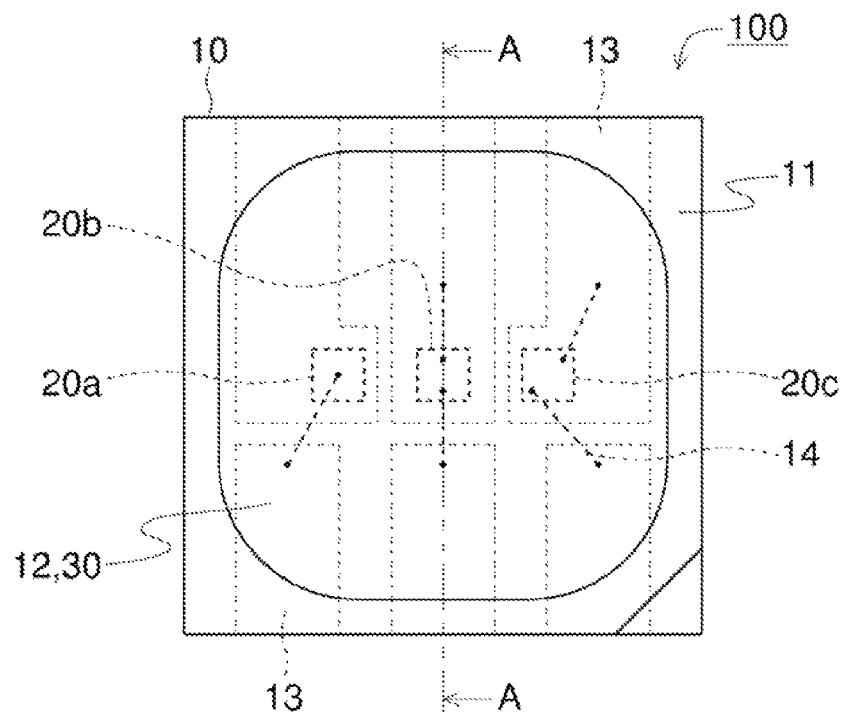
FIG. 1A is a schematic top view of a light emitting device according to an embodiment of the present invention and FIG. 1B is a schematic cross-sectional view taken along line A-A of FIG. 1A.

The embodiments will now be described with reference to the accompanying drawings, wherein like reference numerals designate corresponding or identical elements throughout the various drawings. The light emitting devices described below are intended to exemplify the technical spirit of the present invention, and the scope of the invention is not limited to those described below. Unless otherwise indicated, the sizes, materials, shapes and the relative configuration etc. of the components described below are given as an example and not as a limitation to the scope of the invention. The sizes and the arrangement relationships of the members in each of drawings are occasionally shown exaggerated for ease of explanation.

Embodiment 1

Figure 1B:
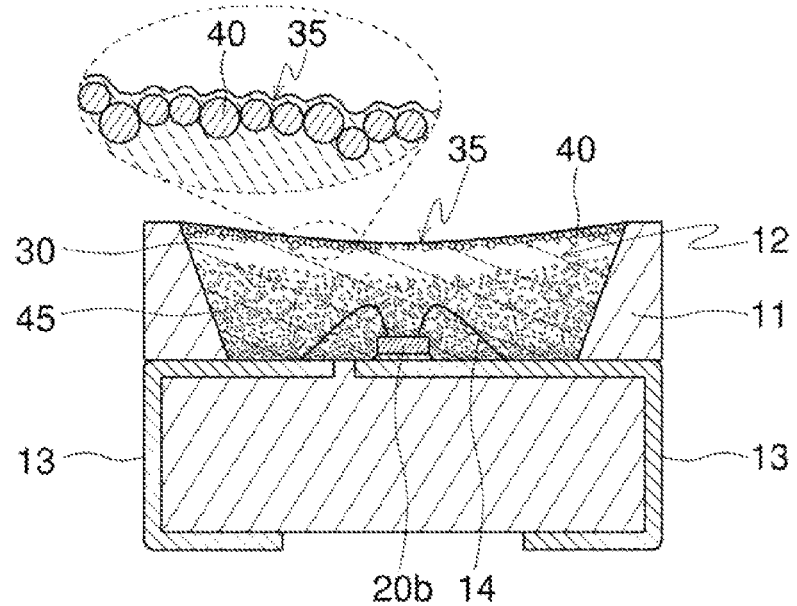

FIG. 1A is a schematic top view of a light emitting device 100 according to Embodiment 1 and FIG. 1B is a schematic cross-sectional view taken along line A-A of FIG. 1A. The light emitting device 100 illustrated in FIGS. 1A and 1B include a base substrate 10, a light emitting element 20 mounted on the base substrate 10, and a sealing member 30 sealing the light emitting element 20. More particularly, the base substrate 10 is a package 11 provided with a recess 12 which opens upward and is defined by the inner walls and a bottom surface. Three sets of a pair of positive and negative lead electrodes 13 are disposed on the bottom surface defining the recess 12. Each light emitting element 20 (20a, 20b, 20c) is bonded to the respective lead electrodes 13 by an adhesive agent and by the wires 14 respectively.

The sealing member 30 contains filler particles (first filler particles) 40 and is filled in the recess 12 defined in the package. The surface 35 of the sealing member 30 constitutes the light emitting surface of the light emitting device 100. The surface 35 of the sealing member is mainly opposite to the mounting surface of the light emitting element 20, and typically constitutes the upper surface of the sealing member but the surface 35 may include apart of the side surfaces continuing from the upper surface. Further, the surface 35 of the sealing member has an irregular geometry associated with the filler particles. That is, with the irregular geometry, the surface 35 of the sealing member is provided with a light scattering surface capable of scattering the incident outside light, so that the surface gloss is reduced. With this arrangement, occurrence of indirect glare at the surface 35 of the sealing member is reduced and a light emitting device of high display contrast can be obtained. The filler particles 40 contained in the sealing member 30 are unevenly distributed in the surface 35 side of the sealing member, so that an irregular geometry associated with the filler particles 40 can be formed efficiently on the surface 35 of the sealing member. The region for forming the irregular geometry may be a part of the surface 35 of the sealing member, but is most preferably approximately the entire area of the surface 35 of the sealing member.

As described above, the surface gloss of the surface of the sealing member can be reduced by forming such irregular geometry on the surface of the sealing member using the filler particles added in the sealing member. This is a greatly simplified operation compared to apply a blast treatment or a gloss eliminating coating on the surface of the sealing member. In the case where a treatment such as a blast treatment for forming unevenness or roughness is performed directly on a parent material such as a resin which constitutes the sealing member, the surface of the sealing member tends to get cloudy, which may results in reduction of display contrast. In contrast, the irregular geometry according to the embodiment of the present invention which is formed associated with the filler particles allows creating a relatively smooth surface of the parent material of the sealing member. Thus, the surface clouding can be prevented and the light from the light emitting element can be extracted outside efficiently. The irregular geometry described above allows scattering of incident outside light by the irregular geometry of the sealing member and scattering of outside light incident on the sealing member by the filler particles present in the surface portion.

In order to arrange the filler particles at the surface portion of the sealing member, a large amount of the filler particles may be added in the sealing member so that the filler particles are dispersed in the entire portion of the sealing member to be deposited to the surface portion. However, in this arrangement, the viscosity of the sealing member increases, which may lead to a decrease in the moldability of the sealing member, and/or may lead to a decrease in the light transmissivity which results in a decrease of the luminosity. Accordingly, in the embodiment of the present invention, with positively using floating and settling of the filler particles in the sealing member, the filler particles can be disposed in the surface portion of the sealing member, even at a relatively small additive amount. In this specification, the term "part" refers to a unit of additive amount of the filler particles and corresponds to a weight (g) of the filler particles with respect to the weight (100 g) of the parent material of the sealing member.

Generally, the filler particles 40 having a small specific gravity (hereinafter, when the filler particles 40 are porous, refers to as "bulk density") with respect to that of the parent material of the sealing member 30 are easily float up. In contrast, the filler particles 40 having a large specific gravity are easily settled. Therefore, for example, when the specific gravity of the filler particles 40 is smaller than that of the parent material of the sealing member 30, curing the sealing member 30 with the upper surface of the base substrate 10, that is the opening of the recess 12, facing upward, allows the filler particles 40 float up to the surface 35 side of the sealing member and unevenly distributed therein. In addition to the above, curing the sealing member 30 with the surface 35 of the sealing member exposed, that is, with the surface 35 of the sealing member not in contact with the mold or the like, an irregular geometry associated with the filler particles 40 can be formed on the surface 35 of the sealing member. When the sealing member 30 is cured with the upper surface of the base substrate 10 facing upward, as in this case, occurrence of voids in the sealing member 30 can be suppressed compared to the case in which the surface of the base substrate 10 is facing downward. The sealing member 30 is preferably made with a single layer which can be easily formed by a single potting operation, but may be made with a plurality of layers. In the present specification, the term "the filler particles 40 are unevenly distributed in a X side of the sealing member" means that when the sealing member 30 is divided in two regions of a X side and a Y side which is at the opposite side to the X side, the proportion of the volume (sum) of the filler particles 40 in the region X with respect to the volume of the region X is larger than the proportion of the volume (sum) of the filler particles 40 in the region Y with respect to the volume of the region Y.

Particularly, in the case where the irregular geometry is formed on the surface 35 by making the filler particles 40 float up to the surface 35 side of the sealing member, the filler particles 40 are preferably porous or hollow that flow easily. When the filler particles 40 are porous or hollow, the particle size may be relatively large, and a particle size of about 1 to 40 μm is preferable. Especially, in order to suitably form the irregular geometry on the surface of the sealing member, the particle size is preferably 1 μm or more and 35 μm or less, more preferably 3 μm or more and 20 μm or less, and most preferably 5 μm or more and 10 μm or less. If the specific gravity is small, the particles float easily, but if the specific gravity is too small, the workability may decreases due to such as uneven distribution of the particles in a dispenser, so that a specific gravity of about 0.4 to 1.0 is preferable. Especially, in order to suitably form the irregular geometry on the surface of the sealing member, the specific gravity is preferably 0.4 or more and 0.8 or less, and more preferably 0.5 or more and 0.6 or less. For this reason, in terms of workability, the porous particles are more preferable. For example, adding one part or more of porous or hollow particles of such a specific gravity and particle size to an epoxy resin enables to form an irregular geometry on the surface 35 of the sealing member to reduce surface gloss. The filler particles 40 may have a spherical shape, but a deposit of low density can be obtained with the particles having an irregular shape such as a crushed shape, which facilitates arrangement of the filler particles 40 at the surface portion of the sealing member 30 with a small additive amount. The filler particles 40 may be a mixture of a plurality of different kinds of particles.

In the case where the filler particles 40 are nonporous, the particles having a large particle size and a large specific gravity are easily settled, and the particles having a small particle size (for example, a particle size in nm range) tends to increase the viscosity of the sealing member 30 even with a small additive amount. For this reason, the particle size is preferably about 1 to 3 μm and the specific gravity is preferably about 1.3 to 2.7. Especially, it is more preferable that the particle size is 1 μm or more and 1.5 μm or less, and the specific gravity is 2.2 or more and 2.6 or less. For example, adding 15 parts or more of nonporous particles 40 of such specific gravity and particle size to an epoxy resin enables to deposit the particles up to the surface portion of the sealing member to form an irregular geometry on the surface 35 of the sealing member. Alternatively, as described later in Embodiment 2, when the sealing member 30 is cured with the upper surface of the base substrate 10 is facing downward, such nonporous particles are suitably used. In such a case, the filler particles 40 having a larger specific gravity are preferable.

As described above, the particles 40 of a first filler is added to form an irregular geometry on the surface 35 of the sealing member to reduce the surface gloss. If such irregular geometry can be formed on the surface 35 of the sealing member by using a small additive amount of the filler particles 40, the usage efficiency of the filler particles 40 can be improved and an increase in the viscosity of the sealing member 30 can be prevented. Accordingly, easiness of molding is improved and adhesion between the sealing member 30 and the base substrate 10 can be improved. For this reason, it is preferable that the filler particles 40 are approximately localized in the surface portion of the sealing member 30. In the specification, the term "approximately localized in the surface portion" refers to an extreme example of the cases of unevenly distributed in the surface side", and indicates a state in which the filler particles 40 are unevenly distributed in the surface portion with a thickness corresponding to a deposit of one to three particles of the filler.

Due to cure shrinkage of the sealing member, the surface 35 of the sealing member tends to form a concave surface with a dent in the middle portion (in other words, center portion) which rises toward the peripheral portion. As described above, in the case where the surface 35 of the sealing member is a concave surface dented from the peripheral portion toward the middle portion, indirect glare tends to occur at the surface of the peripheral portion. For this reason, it is preferable that the filler particles 40 are unevenly distributed in the peripheral portion side of the sealing member 30. When the sealing member 30 is cured, in which the surface 35 is formed with such a concave surface, the filler particles 40 float up or settled toward the surface 35 side and tend to gather around the peripheral portions where more free volume is available in the sealing member 30. Accordingly, an irregular geometry associated with the filler particles 40 can be formed easily in the peripheral portion of the surface 35 of the sealing member, so that incident outside light which is the cause of indirect glare can be scattered efficiently. The recessing amount of the surface 35 of the sealing member is typically about 10 μm or less, and up to about 150 μm.

The parent material of the sealing member 30 preferably covers the filler particles 40. That is, it is preferable that the irregular geometry of the surface 35 is formed in a manner that the surface of the parent material of the sealing member 30 is approximately in conformity with the shapes of the filler particles 40. With this arrangement, the filler particles 40 are prevented from detaching from the sealing member 30, so that the reliability of the device can be improved. Also, with the irregular geometry of the surface of the parent material of the sealing member 30 and the filler particles 40 in the surface portion of the sealing member 30, incident outside light can be scattered efficiently. Also, it is not limited to those described above, the filler particles 40 may be exposed from the parent material of the sealing member 30 so that the irregular geometry of the surface 35 of the sealing member is formed with the surface of the parent material of the sealing member 30 and the surfaces of the filler particles 40. The both types of configurations described above may be used in combination.

When the difference in the refractive index between the parent material of the sealing member 30 and the filler particles 40 is small, the light-blocking effect of the filler particles 40 in the sealing member 30 is reduced and light from the light emitting element 20 can be efficiently extracted to the outside, so that luminosity of the device can be enhanced. For this reason, the difference in the refractive index between the parent material of the sealing member 30 and the filler particles 40 is preferably 0.1 or less. For example, when an epoxy resin is used as the parent material of the sealing member 30, silica (glass) is preferably used as the filler particles 40.

A plurality of kinds of filler particles can be added in the sealing member 30. In addition to the first filler particles 40 for reducing the gloss of the surface 35 of the sealing member, second filler particles 45 may also be added for different purpose. In the light emitting device 100, the second filler particles 45 are unevenly distributed in the bottom surface side of the recess 12, that is the bottom side of the sealing member 30, and are added to serve mainly as light diffusing agent to control the distribution of light. Also, the second filler particles 45 also exert an effect of suppressing thermal expansion and contraction of the sealing member 30 around the wires 14 to reduce the stress loaded on the wires 14. As the second filler particles 45, particles of darker color such as carbon black may be used to improve the display contrast. As described above, in the case where the first filler particles 40 which tend to float and the second filler particles 45 which tend to settle are added to the sealing member 30, apart of the first filler particles 40 are prevented from floating up by the second filler particles 45 and stay among the second filler particles 45, but the irregular geometry can be formed on the surface 35 by the first filler particles 40 which float up between the second filler particles 45 to the surface portion. Particularly, in such a case, a third region made almost only with the parent material of the sealing member is preferably provided between the first region in which the first filler particles 40 are unevenly distributed and the second region in which the second filler particles 45 are unevenly distributed. This arrangement allows the third region to serve as the light transmitting region, and thus enables to improve the luminosity. It is more preferable that the first to third regions are respectively provided in the sealing member 30, as a form of layers each extends substantially throughout the entire in-plane regions.

The sealing member 30 may be formed extending from the recess 12 upwardly to at least a part of the upper surface of the package 11. An irregular geometry due to the filler particles 40 may be formed on the surface of the sealing member 30 which covers the surface of the package 11 as described. With this arrangement, generation of indirect glare at the upper surface of the package 11 can be decreased. The upper surface of the package 11 may be provided with a step which is continuous to the recess 12 and the sealing member 30 is disposed to cover the step.

Embodiment 2

Figure 2:
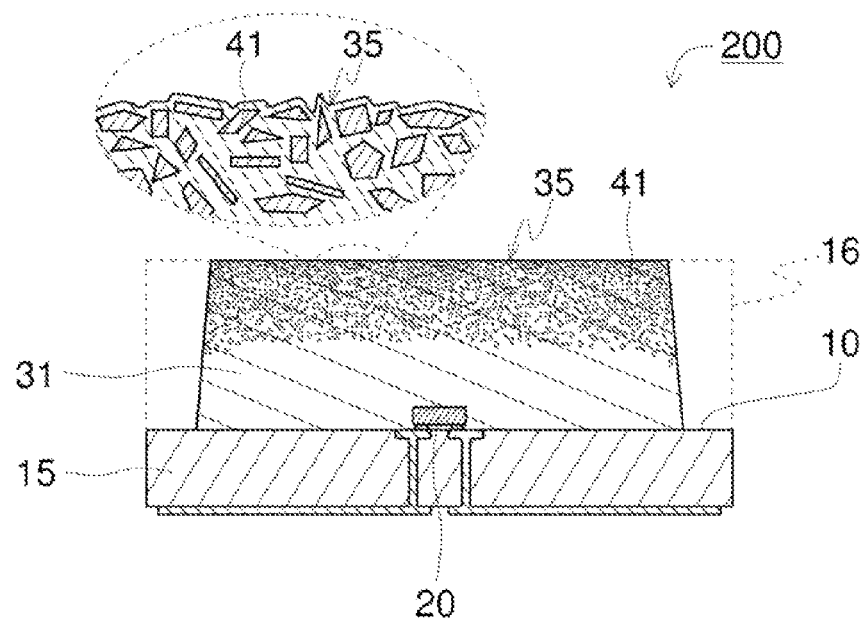
FIG. 2 is a schematic cross-sectional view of a light emitting element according to an embodiment of the present invention.

FIG. 2 is a schematic cross-sectional view of a light emitting device 200 according to Embodiment 2 of the present invention. In the light emitting device 200, description of a structure which is approximately the same as in Embodiment 1 may be omitted. In the light emitting device 200 illustrated in FIG. 2, the base substrate 10 is a circuit board 15 having a conductive wiring on its upper surface and a light emitting element 20 is mounted on the conductive wiring in a flip-chip manner. The sealing member 31 contains the filler particles 41 and seals the light emitting element 20 and molded on the circuit board 15. The sealing member 31 has an approximately rectangular parallelepiped shape and is capable of emitting light from the surface (upper surface) 35 and the side surfaces. The filler particles 41 are unevenly distributed to the surface 35 side of the sealing member, and the surface 35 of the sealing member has an irregular geometry associated to the filler particles 41 to reduce the surface gloss.

Such a sealing member 31 is formed such a way that, a frame 16 for surrounding the light emitting element 20 is provided on the circuit board 15 and the sealing member 31 containing the filler particles 41 is added in drops into the frame 16, and then cured. At this time, in the case where the specific gravity of the filler particles 41 is larger than that of the parent material of the sealing member 31, the sealing member 31 is cured with the upper surface of the base substrate 10 facing downward and the surface 35 of the sealing member 35 is exposed. With this, the filler particles 41 are settled to the surface 35 side of the sealing member and the irregular geometry associated with the filler particles 41 can be formed on the surface 35. Also, the filler particles 41 may be served as a light scattering agent. The first filler particles 41 to be settled at the surface 35 side of the sealing member and the above-described second filler particles 45 may be fluorescent particles such as YAG having a relatively large specific gravity. The frame 16 may be removed after forming the sealing member 31 as in the present example, or retained to serve the package as described above. Alternately, forming the side surfaces of the sealing member 31 by using the frame 16 having an irregular geometry on the inner side surfaces, the side surfaces of the sealing member 31 can be used as the light scattering surfaces.

Each constituent component of the light emitting device according to the embodiment of the present invention will be described in detail below.

(Base Substrate)

The base substrate is a supporting member for supporting the light emitting element, and including a package, a circuit board, and the like. The package includes a lead electrode which supports the light emitting element and has a function of protecting the light emitting element from the external environment. It is preferable that the package has high mechanical strength and hardly permeates light from the light emitting element and incident outside light. More specifically, a PPA (polyphthalamide) resin, a phenol resin, a BT resin (bismaleimide triazine resin), an epoxy resin, a silicone resin, a ceramics ($Al_2O_3$, AlN, or the like) may be used. The package may be made of white color which is excellent in light extraction efficiency, but at least a part of the upper surface of the package is preferably made of a dark color such as black so as to reduce the reflectance of incident outside light and an irregular geometry may be formed so as to scatter incident outside light. The inner wall defining the recess may also be made of a dark color to enhance display contrast, or the inner wall defining the recess may be made of white color to enhance light extraction efficiency. A circuit board, in which a conductive wiring for connecting to a light emitting element and an external terminal is formed on a variety of substrates made of such as a glass epoxy, a ceramics, or an aluminum, can be used.

(Light Emitting Element)

For the light emitting element, a semiconductor light emitting element, for example, an LED element or a semiconductor laser (LD; Laser Diode) element capable of emitting visible light can be used. Such a light emitting element has a structure, for example, a stacked-layer structure including a p-type semiconductor layer, an active layer, and an n-type semiconductor layer is formed on a substrate, using various kinds of semiconductors such as a nitride, a group III-V compound, and a group II-VI compound. A wavelength converting member containing a fluorescent material may be used together. In the case where the light emitting device is to be used in a full-color display apparatus, three or more light emitting elements capable of emitting red, green, or blue light, respectively, are preferably mounted in one light emitting device. The number of the light emitting element mounted in one light emitting device is not limited thereto and one light emitting element may be used. The combination of the light emitting elements is not limited thereto and a white light emitting element may be used.

(Sealing Member)

The sealing member is provided to protect the light emitting element and the wires, and the like. The parent material of the sealing member is not specifically limited as long as it has light transmissive property. For example, it can be selected from one or two or more kinds of resins of an epoxy resin, a modified epoxy resin, a glass epoxy resin, a silicone resin, a modified silicone resin, a polyolefin resin, a polycarbonate resin, a polystyrene resin, an acrylic resin, an acrylate resin, a methacrylate resin (PMMA resin), a urethane resin, a polyimide resin, a polynorbornene resin, and a fluororesin, and a liquid crystal polymer, and a glass. Among those, an epoxy resin or a silicone resin, which are excellent in light resistance and heat resistance, are preferable. An epoxy resin can be cured with an acid anhydride curing agent, a cationic curing agent, an amine curing agent, a phenol curing agent, or the like. Among those, curing with an acid anhydride curing agent which is excellent in light transmissivity, or curing with a cationic curing agent which is low-volatile and has an excellent productivity is preferable. Curing with an acid anhydride curing agent is preferable compared to curing with a cationic curing agent, because of the lower viscosity, it facilitates floating up or settling down of the filler particles. As a silicone resin, a dimethyl silicone or phenyl silicone of an addition polymerization type or condensation polymerization type can be used. Especially, an addition polymerization type is preferable because it has a small change in the volume and the surface shape due to the dealcoholization reaction during curing. Further, a pigment or a dye may be added to the sealing member to improve display contrast, and/or an antioxidizing agent or an ultraviolet absorbing agent may be added to the sealing member to improve light resistance.

(Filler Particles)

For the filler particles, for example, silica, titanium oxide, calcium carbonate, calcium silicate, ferric oxide, carbon black, zinc oxide, barium titanate, aluminum oxide, or the like can be used. Among those, silica is most preferable in view of the specific gravity, the particle size, and the difference in the refractive indices with the parent material of the sealing member, which are suitable for forming the irregular geometry on the surface of the sealing member. Following this, calcium silicate, calcium carbonate, and calcium oxide are preferable. Other than those, with using particles of a thermosetting resin such as a silicone resin, an irregular geometry can be formed on the surface of the sealing member.

EXAMPLES

Hereinafter, the present invention will be described in detail in the following examples. However, the present invention should not be construed as being limited by these examples.

Example 1

The light emitting device according to Example 1 is an example of the light emitting device 100 according to Embodiment 1 and a surface mount type LED having an outer shape of an approximately rectangular parallelepiped with 3.0 mm in length, 3.0 mm in width, and 1.8 mm in height. The base substrate 10 is a package 11 defining a recess 12 in approximately the center of the upper surface. The package 11 is such that the outer portion is made of a PPA resin containing carbon black and the recess 12 is provided with a PPA resin containing titanium oxide. The recess 12 is defined in approximately square shape with rounded corners in plan view (2.6 mm in length, 2.6 mm in width, and 0.8 mm in depth) and the inner side walls defining the recess are tapering from the bottom surface toward the upper surface side. The bottom surface of the recess 12 defined in the package is provided with three sets of a pair of positive and negative lead electrodes 13 which are made of silver-plated copper plate containing iron and respectively extend to outside bending along the corresponding side surface and the lower surface (back surface) of the package 11. The light emitting elements 20a, 20b, and 20c each having an approximately rectangular shape are LED elements respectively having emission colors (emission wavelengths) of red (630 nm), green (550 nm), or blue (460 nm), and bonded to the corresponding lead electrodes 13 by an adhesive (a silver paste for 20a and an epoxy resin for 20b and 20c) and electrically connected to the corresponding electrodes by a wire 14, respectively.

The sealing member 30 filled in the recess 12 of the package is an alicyclic epoxy resin (specific gravity 1.14) added with an aromatic sulfonium salt and contains one part of spherical porous silica having an average particle diameter of 4.5 μm, a bulk density of 0.51 as a first filler particles 40, and 20 parts of crushed nonporous silica having an average particle diameter of 7 μm and a specific gravity of 2.65 as a second filler particles 45. The refractive index (at wavelength 589 nm) of the epoxy resin to be used is 1.52 and the refractive index of silica is 1.55. In the sealing member 30, the first filler particles 40 are unevenly distributed to present approximately in the surface portion of the sealing member 30 and the second filler particles 45 are unevenly distributed in the bottom surface side portion of the sealing member 30. The surface 35 of the sealing member has an irregular geometry formed so that the surface of the resin covering the first filler particles 40 is approximately in conformity with the shapes of the particles, and has practically no gloss. Such a sealing member 30 can be formed such that the first filler particles 40 and the second filler particles 45 are mixed to substantially uniformly dispersed in a liquid epoxy resin, and then added in drops (potting) in the recess 12 of the package, and then it is cured at a temperature of 140 C. for 4 hours with the upper surface of the base substrate 10 facing upward and the surface of the resin being exposed. This time, the surface 35 of the sealing member forms a concave surface with a dent of about 5 μm from the peripheral portion to the center portion.

Example 2

The light emitting device according to Example 2 has a similar structure as the light emitting device in Example 1 except for the filler particles. The sealing member 30 of the light emitting device of Example 2 contains, as the filler particles 40, 10 parts of spherical porous silica having an average particle diameter of 4.0μ and a bulk density of 0.5 in an epoxy resin similar to that in Example 1. The filler particles 40 are unevenly distributed in the surface side of the sealing member 30. The surface 35 of the sealing member has an irregular geometry formed by the resin covering the filler particles 40 approximately in conformity with the shapes of the filler particles, and has practically no gloss.

Example 3

The light emitting device according to Example 3 has a similar structure as the light emitting device in Example 1 except for the filler particles. The sealing member 30 of the light emitting device of Example 3 contains, as the filler particles 40, 10 parts of hollow spherical silica having an average particle diameter of 40 μm and a specific gravity of 0.35 in an epoxy resin similar to that in Example 1. The filler particles 40 are unevenly distributed in the surface side of the sealing member 30. The surface 35 of the sealing member has an irregular geometry formed by the resin covering the filler particles 40 approximately in conformity with the shapes of the filler particles, and has practically no gloss.

Example 4

The light emitting device according to Example 4 has a similar structure as the light emitting device in Example 1 except for the filler particles. The sealing member 30 of the light emitting device of Example 4 contains, as the filler particles 40, 20 parts of nonporous crushed silica having an average particle diameter of 7 μm and a specific gravity of 2.65 in an epoxy resin similar to that in Example 1. The filler particles 40 are unevenly distributed in the surface side of the sealing member 30. The surface 35 of the sealing member has an irregular geometry formed by the resin covering the filler particles 40 approximately in conformity with the shapes of the filler particles, and has practically no gloss. The sealing member 30 can be formed such that the filler particles 40 are substantially uniformly mixed in a liquid epoxy resin, and added in drops in the recess 12 of the package, and then it is cured at a temperature of 140 C. for 4 hours with the upper surface of the base substrate 10 facing upward and the surface of the resin being exposed.

Example 5

The light emitting device according to Example 5 has a similar structure as the light emitting device in Example 2 except for the parent material of the sealing member. The sealing member 30 of the light emitting device of Example 2 is made of an epoxy resin which contains 10 parts of the filler particles 40 of porous spherical silica having an average particle size of 4.0 μm, a bulk density of 0.5. The epoxy resin (specific gravity of 1.1 to 1.2) is made of a base resin (an alicyclic epoxy resin, a bisphenol-type epoxy resin, or a mixture thereof) and a curing agent in which a quaternary phosphonium salt is added as a curing accelerator to hexahydrophthalic anhydride which is an acid anhydride. The filler particles 40 are unevenly distributed in the surface side of the sealing member 30. The surface 35 of the sealing member has an irregular geometry formed by the resin covering the filler particles 40 approximately in conformity with the shapes of the filler particles, and has practically no gloss.

Example 6

The light emitting device according to Example 6 has a similar structure as the light emitting device in Example 1 except for the parent material of the sealing member and the filler particles. The sealing member 30 of the light emitting device of Example 6 is made of a dimethyl silicone resin (specific gravity of 1.02) of condensation polymerization type which contains 10 parts of the filler particles 40 of hollow spherical silica having an average particle size of 1.8 μm, a specific gravity of 0.32. The filler particles 40 are unevenly distributed in the surface side of the sealing member 30. The surface 35 of the sealing member has an irregular geometry formed by the resin covering the filler particles 40 approximately in conformity with the shapes of the filler particles, and has practically no gloss.

Comparative Example 1

The light emitting device according to Comparative Example 1 has a similar structure as the light emitting device in Example 1 except for the filler particles. The sealing member of Comparative Example 1 contains the filler particles similar to that in Example 4, but curing is performed with the upper surface of the base substrate facing upward and the filler particles are unevenly distributed in the bottom surface side of the sealing member. Accordingly, the surface of the sealing member is practically flat and has gloss.

Comparison of Luminosity

The light emitting devices of Examples 1, 2, and Comparative Example 1 are respectively turned on at the current value of 20 mA and their luminosity are compared and analyzed. The luminosity of the light emitting device of Example 1 is red 1.00, green 1.03, and blue 1.01, and the luminosity of the light emitting device of Example 2 is red 1.03, green 1.08, and blue 1.02 with the luminosity of each emission color of the light emitting device of Comparative Example 1 being 1.00. As shown above, the light emitting devices of Examples 1 and 2 are capable of suppressing surface gloss of the sealing member while maintaining high luminosity. Also, the luminosities of the light emitting devices of Examples 1, 2 are higher than that of the light emitting device of Example 1, and the light extraction efficiency can be enhanced with the formation of irregular geometry associated with the filler particles on the surface of the sealing member.

According to the embodiment of the present invention, the surface gloss of the sealing member sealing a light emitting element can be reduced by using the filler particles efficiently.

The light emitting device according to the present invention can be used for display apparatuses for applications such as advertisements, destination signs, road information, or the like, traffic signals, small to large displays and the like.

It is to be understood that although the present invention has been described with regard to preferred embodiments thereof, various other embodiments and variants may occur to those skilled in the art, which are within the scope and spirit of the invention, and such other embodiments and variants are intended to be covered by the following claims.

What is claimed is:

1. A light emitting device comprising:
  a base substrate;
  a light emitting element provided on the base substrate; and
  a sealing member to seal the light emitting element, the sealing member containing a parent material and filler particles unevenly distributed in a surface side of the sealing member and having a surface which has an irregular geometry formed associated with the filler particles, the sealing member being a single layer,
  wherein the filler particles are porous or hollow,
  wherein the base substrate is a package having a recess and lead electrodes disposed on a bottom surface of the recess,
  wherein the sealing member is provided substantially only in the recess,
  wherein the filler particles are made of at least one material selected from a group of silica, titanium oxide, calcium carbonate, calcium silicate, ferric oxide, carbon black, zinc oxide, barium titanate, and aluminum oxide,
  wherein the parent material of the sealing member is one selected from a group of an epoxy resin and a modified epoxy resin,
  wherein the parent material of the sealing member and the filler particles have a difference in refractive index of 0.1 or smaller, and
  wherein the sealing member comprises second filler particles made of silica unevenly distributed in the bottom surface side of the recess.

2. The light emitting device according to claim 1, wherein the surface of the sealing member is a concave surface which dents from a peripheral portion of the sealing member toward a center portion of the sealing member, and the filler particles are unevenly distributed in the peripheral portion of the sealing member.

3. The light emitting device according to claim 1, wherein the parent material of the sealing member covers the filler particles.

4. The light emitting device according to claim 1, wherein the filler particles are substantially localized in a portion in a vicinity of the surface of the sealing member.

5. The light emitting device according to claim 1, wherein the filler particles are porous particles.

6. The light emitting device according to claim 1, wherein the parent material of the sealing member is an epoxy resin curing with a cationic curing agent.

7. The light emitting device according to claim 1, wherein the parent material of the sealing member is a silicone resin of an addition polymerization type.

8. The light emitting device according to claim 1, wherein particle size of the filler particles is 1 μm or more and 35 μm or less.

9. The light emitting device according to claim 1, wherein the specific gravity of the filler particles is 0.4 or more and 0.8 or less.

10. The light emitting device according to claim 1, wherein the filler particles are made of silica.

11. The light emitting device according to claim 1, wherein the filler particles have a crushed shape.

12. The light emitting device according to claim 1, wherein the filler particles have a spherical shape.

13. The light emitting device according to claim 1, wherein the filler particles are exposed from a parent material of the sealing member so that the irregular geometry of the surface of the sealing member is formed with a surface of the parent material of the sealing member and the surfaces of the filler particles.

14. The light emitting device according to claim 1, wherein the light emitting element is capable of emitting red light, further comprising a light emitting element capable of emitting green light and a light emitting element capable of emitting blue light.

15. The light emitting device according to claim 1, wherein the filler particles are hollow.

16. The light emitting device according to claim 1, wherein the filler particles have an irregular shape.

17. The light emitting device according to claim 1, wherein the second filler particles are nonporous.

18. The light emitting device according to claim 1,
  wherein the filler particles are provided within a first region of the sealing member in the surface side of the sealing member,
  wherein the second filler particles are provided within a second region of the sealing member on the bottom surface side, and
  wherein the sealing member includes a third region that is provided between the first region and the second region, the third region being substantially entirely formed of the parent material without the filler particles or the second filler particles provided therein.

19. The light emitting device according to claim 1, wherein at least a part of an upper surface of the package is black.

20. A light emitting device comprising:
- a base substrate having a recess;
- a light emitting element provided on a bottom surface of the recess; and
- a sealing member provided in the recess to seal the light emitting element,
- wherein the sealing member containing first filler particles unevenly distributed in an upper surface side of the sealing member and having a surface which has an irregular geometry formed associated with the first filler particles, the sealing member being a single layer, and
- wherein the sealing member comprises second filler particles made of silica unevenly distributed in a bottom surface side of the recess.

\* \* \* \* \*